United States Patent [19]
Matsuo

[11] Patent Number: 5,841,490
[45] Date of Patent: Nov. 24, 1998

[54] LIQUID CRYSTAL DISPLAY DEVICE AND ITS FABRICATING METHOD

[75] Inventor: Shigeki Matsuo, Yohkaichi, Japan

[73] Assignee: Kyocera Corporation, Kyoto, Japan

[21] Appl. No.: 550,721

[22] Filed: Oct. 31, 1995

[30] Foreign Application Priority Data

Oct. 31, 1994 [JP] Japan .................................. 6-267819
Feb. 24, 1995 [JP] Japan .................................. 7-037318
Jun. 29, 1995 [JP] Japan .................................. 7-163369

[51] Int. Cl.$^6$ .................................................. G02F 1/1333
[52] U.S. Cl. ............................................................. 349/40
[58] Field of Search ............................................ 349/40

[56] References Cited

U.S. PATENT DOCUMENTS

| | | | |
|---|---|---|---|
| 4,807,973 | 2/1989 | Kawasaki | 349/40 |
| 5,068,748 | 11/1991 | Ukai et al. | 349/40 |
| 5,144,392 | 9/1992 | Brotherton | 349/40 |
| 5,200,876 | 4/1993 | Takeda et al. | 349/40 |
| 5,220,443 | 6/1993 | Noguchi | 349/40 |
| 5,233,448 | 8/1993 | Wu | 349/40 |
| 5,469,025 | 11/1995 | Kanemori et al. | 349/40 |
| 5,521,728 | 5/1996 | Kodate et al. | 349/40 |
| 5,657,139 | 8/1997 | Hayashi | 349/40 |
| 5,668,032 | 9/1997 | Holmberg et al. | 349/40 |

*Primary Examiner*—William L. Sikes
*Assistant Examiner*—James A. Dudek
*Attorney, Agent, or Firm*—Loeb & Loeb LLP

[57] ABSTRACT

Disclosed are a liquid crystal display device and its fabricating method, which are minimized in the number of contact holes required to be formed in the insulating film, simplified in fabricating processes, prevented from reduction in fabrication yield, and prevented from increase in fabrication cost. In the liquid crystal display device, in which a plurality of image signal lines and a plurality of scan signal lines are provided so as to cross each other via an insulating film, pixel electrodes and switching devices for feeding an image signal to the pixel electrodes are provided in a matrix shape at intersecting points of the image signal lines and the scan signal lines, the switching devices being each composed of at least a gate electrode, the insulating film, a semiconductor film, a source electrode, and a drain electrode, and in which a liquid crystal material is sandwiched between the pixel electrodes and opposite electrodes provided opposite to the pixel electrodes, the liquid crystal display device being characterized in that the pixel electrodes and the drain electrodes of the switching devices are provided on the same side as the insulating film is provided; a short-circuit ring line to which the plurality of image signal lines are connected via a transistor is provided; and that the gate electrode and the source electrode or the drain electrode of the transistor are capacitance-coupled to each other via the insulating film.

8 Claims, 10 Drawing Sheets

LIQUID CRYSTAL DISPLAY DEVICE AND ITS FABRICATING METHOD

BACKGROUND OF THE INVENTION

Field of the Invention

The present invention relates to an LCD (Liquid Crystal Display) device and its fabricating method. More specifically, the invention relates to an active-matrix type LCD device using a panel having switching devices such as thin film transistors provided at individual pixel portions (hereinafter, referred to as TFT array panel), as well as to a method for fabricating the LCD device.

Active-matrix type LCD devices have been an indispensable technique for color LCD devices, by virtue of their higher contrast and superior multi-tone display characteristic over simple-matrix type LCD devices. In particular, active-matrix type LCD devices using thin film transistors as the switching devices have been enabled to obtain image qualities equivalent to CRTs.

A conventional LCD device is described below with reference to the accompanying drawings.

Figure 16:
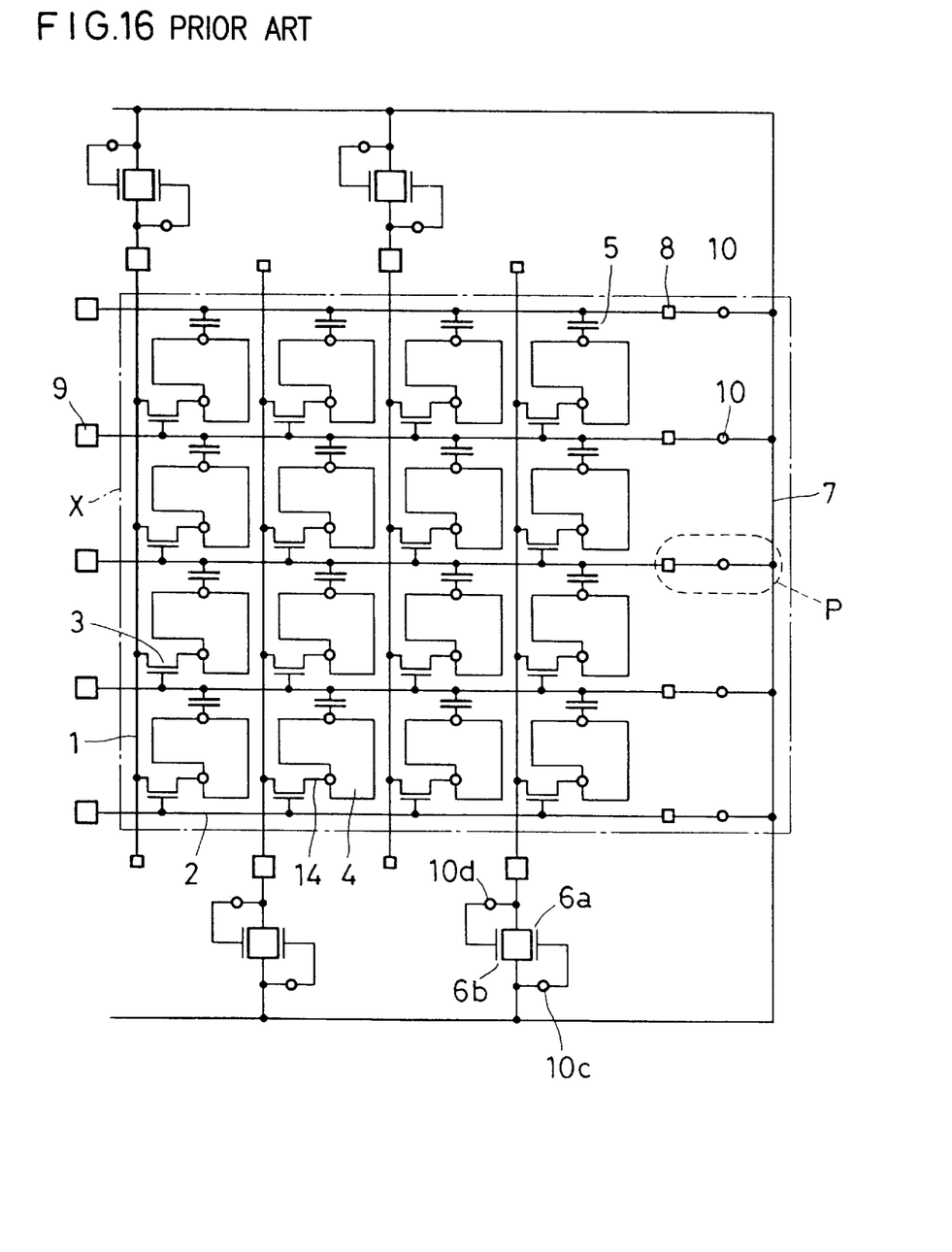
FIG. 16 is an equivalent circuit diagram of a TFT array panel in a conventional LCD device.
Figure 17:
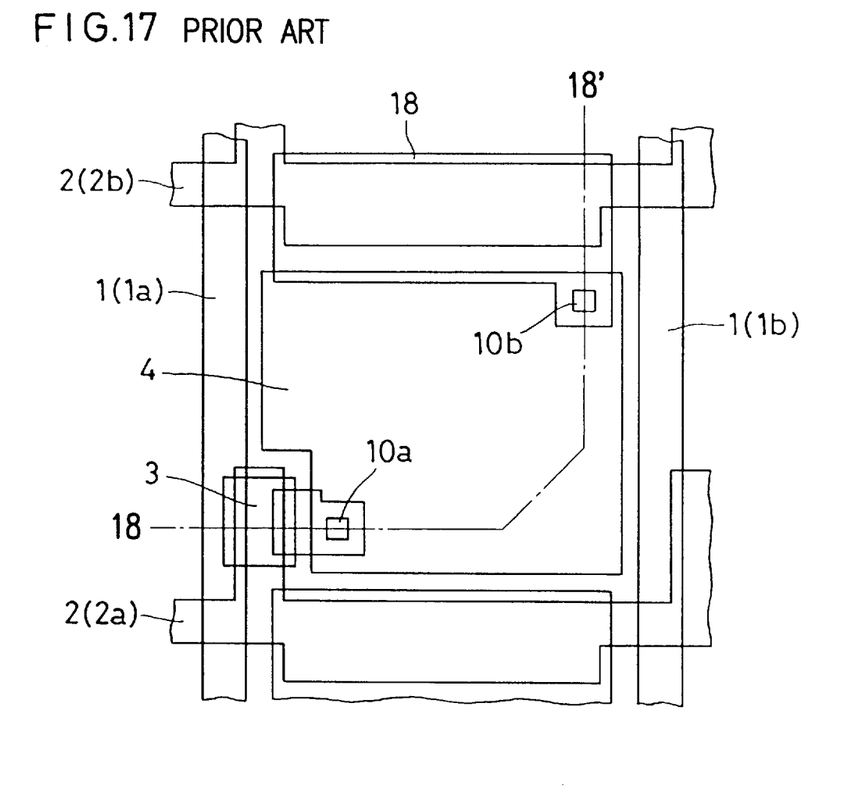
FIG. 17 is a plane view of one pixel of the TFT array panel in the conventional LCD device.
Figure 18:
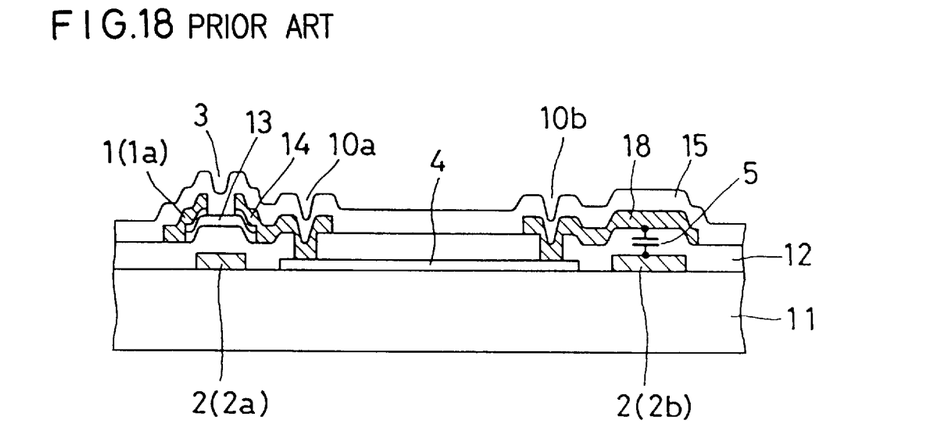
FIG. 18 is a sectional view taken along the line 18–18' of FIG. 17.

FIG. 16 is an equivalent circuit diagram of the TFT array panel in the conventional LCD device. FIG. 17 is a plane view of one pixel in the TFT array panel in the conventional LCD device. FIG. 18 is a sectional view taken along the line A–A' of FIG. 17.

This active-matrix type LCD device performs image display in a way that thin film transistors 3 are switched by a scan signal fed from scan signal lines 2, causing a signal voltage of image signal lines 1 to be applied to pixel electrodes 4 connected to drain electrodes 14, whereby a voltage is applied to a liquid crystal material (not shown) sandwiched between the pixel electrodes 4 and their opposite electrodes (not shown).

This conventional LCD device, as shown in FIGS. 17 and 18, is constructed in a way that the image signal lines 1 and the scan signal lines 2 are provided so as to cross each other with an insulating film 12 interposed therebetween, wherein at places where the image signal lines 1 and the scan signal lines 2 cross each other, provided in a matrix shape are the pixel electrodes 4, the thin film transistors 3 each comprising a gate electrode 2a for feeding an image signal to the pixel electrodes 4, an insulating film 12, a semiconductor film 13, a source electrode 1a, and a drain electrode 14, and an additional capacitor 5 for holding the fed image signal voltage.

In this construction, the pixel electrode 4, the drain electrode 14 of the thin film transistor 3, and the additional-capacitor electrode 18 are connected to one another via contact holes 10a, 10b formed in the insulating film 12.

With this arrangement, it would often occur that the TFT array panel is charged with strong static electricity during the fabrication and other processes of the LCD device, causing a high voltage due to the static electricity to be applied between the gate electrode 2a and the source electrode 1a of the thin film transistor 3, or between the scan signal lines 2 and the image signal lines 1, such that the insulating film 12 results in a dielectric breakdown.

Accordingly, in the conventional LCD device, as shown in FIG. 16, a short-circuit ring line 7 is provided outside a display area X, and the scan signal lines 2 are connected to this short-circuit ring line 7, while the image signal lines 1 are connected thereto via high-voltage protection transistors 6a, 6b.

Figure 19:
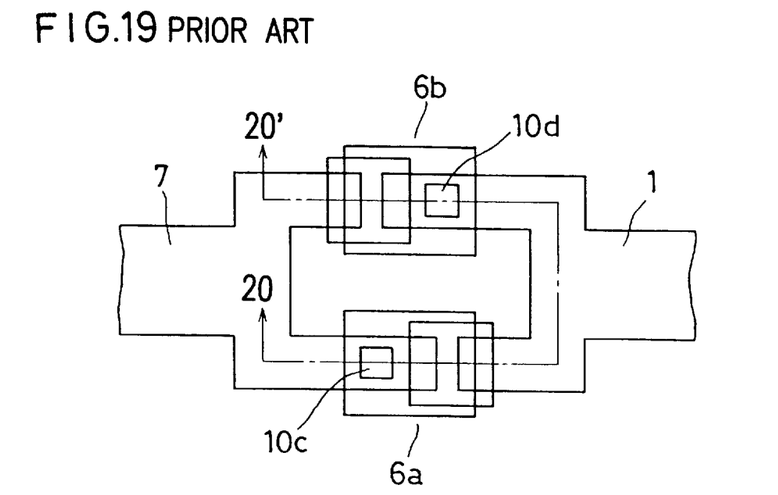
FIG. 19 is a plane view of a high-voltage protection transistor portion in the conventional LCD device.
Figure 20:
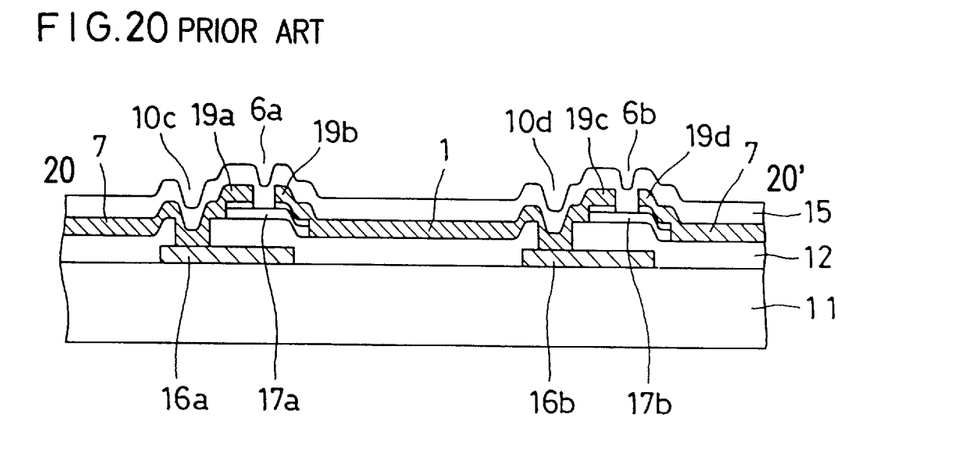
FIG. 20 is a sectional view taken along the line 20–20' of FIG. 19.

These high-voltage protection transistors 6a, 6b, as shown in FIGS. 19 and 20, comprise gate electrodes 16a, 16b, a gate insulating film 12, and source electrodes or drain electrodes 19a, 19b, 19c, 19d. The source electrode or drain electrode 19a of the transistor 6a is connected to the short-circuit ring line 7, and the source electrode or drain electrode 19b is connected to the image signal line 1. Also, the source electrode or drain electrode 19c of the transistor 6b is connected to the image signal line 1, and the source electrode or drain electrode 19d is connected to the short-circuit ring line 7. Further, the gate electrode 16a of the transistor 6a is connected to the short-circuit ring line 7 via a contact hole 10c, and the gate electrode 16b of the transistor 6b is connected to the image signal line 1 via a contact hole 10d. In addition, FIG. 19 is a plane view of the high-voltage protection thin film transistor provided around the TFT array panel in the conventional LCD device, and FIG. 20 is a sectional view taken along the line B–B' of FIG. 19.

Figure 21:
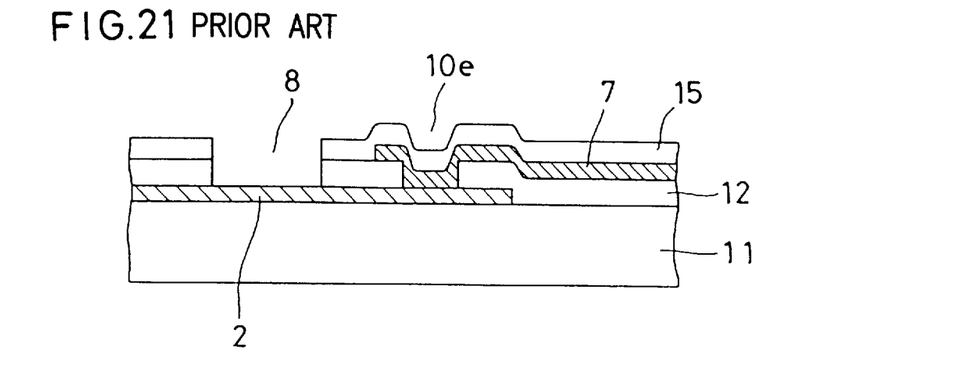
FIG. 21 is a sectional view of P portion of FIG. 16.

As shown in FIG. 21, the scan signal line 2 is connected to the short-circuit ring line 7 at the contact hole 10e formed in the insulating film 12. In addition, FIG. 21 is a sectional view of P portion of FIG. 16.

As shown above, it has been the conventional practice that the image signal lines 1 are connected to the short-circuit ring line 7 via the high-voltage protection thin film transistors 6a, 6b, and the scan signal lines 2 are connected directly to the short-circuit ring line 7, wherein charges of static electricity are discharged to the short-circuit ring line 7, so that dielectric breakdown due to static electricity can be prevented.

In the conventional LCD device as described above, as shown in FIGS. 17 and 18, the pixel electrode 4 is formed on the opposite side to the drain electrode 14 and the additional-capacitor electrode 18 with the insulating film 12 interposed therebetween. Due to this arrangement, there has been a problem that the contact holes 10a, 10b for connecting the pixel electrode 4 to the drain electrode 14 and the additional-capacitor electrode 18 must be formed in the insulating film 12.

Also, as shown in FIGS. 19 and 20, the high-voltage protection thin film transistors 6a, 6b provided around the display area have the gate electrodes 16a, 16b and the source electrodes or drain electrodes 19a, 19c connected to each other via the contact holes 10c, 10d. This would require the contact holes 10c, 10d to be formed in the insulating film 12 (see Japanese Patent Laid-Open Publication No. SHO 63-220289).

Further, as shown in FIG. 21, the scan signal line 2 and the short-circuit ring line 7 would be connected to each other via a contact hole 10e formed in the insulating film 12.

As a result, for the conventional LCD device, a photoresist process for boring the contact holes 10a to 10e in the insulating film 12 would be necessitated. This would result in complex fabricating processes that would cause problems such as reduction in fabrication yield and increase in fabrication cost.

SUMMARY OF THE INVENTION

A first object of the present invention is therefore to provide an LCD device and its fabricating method which can minimize the number of contact holes required to be formed in the insulating film, simplify the fabricating processes, solve the reduction in the fabrication yield, and can suppress the increase in the fabrication cost.

A second object of the present invention is to provide a method for fabricating an LCD device in which static electricity between a first short-circuit ring line, to which image signal lines are connected, and a second short-circuit ring line, to which scan signal lines are connected, can be absorbed completely.

BRIEF DESCRIPTION OF THE DRAWINGS

These and other objects and features of the present invention will be understood in more detail by the accompanying drawings illustrated by way of example, and by following description, in which.

DETAILED DESCRIPTION OF THE PREFERRED EMBODIMENTS

Figure 1:
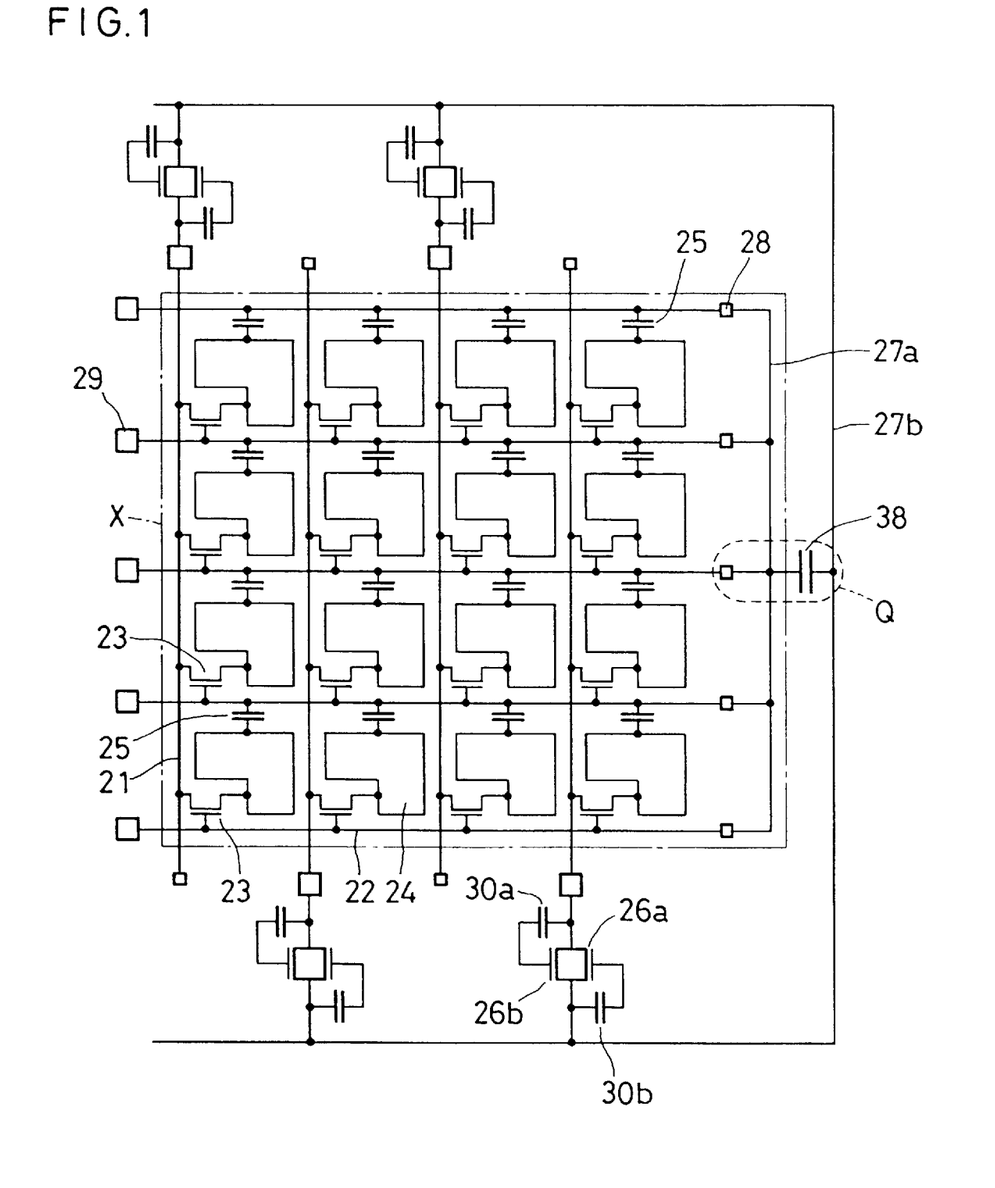
FIG. 1 is an equivalent circuit diagram of a TFT array panel showing a first embodiment of the LCD device according to the present invention.
Figure 2:
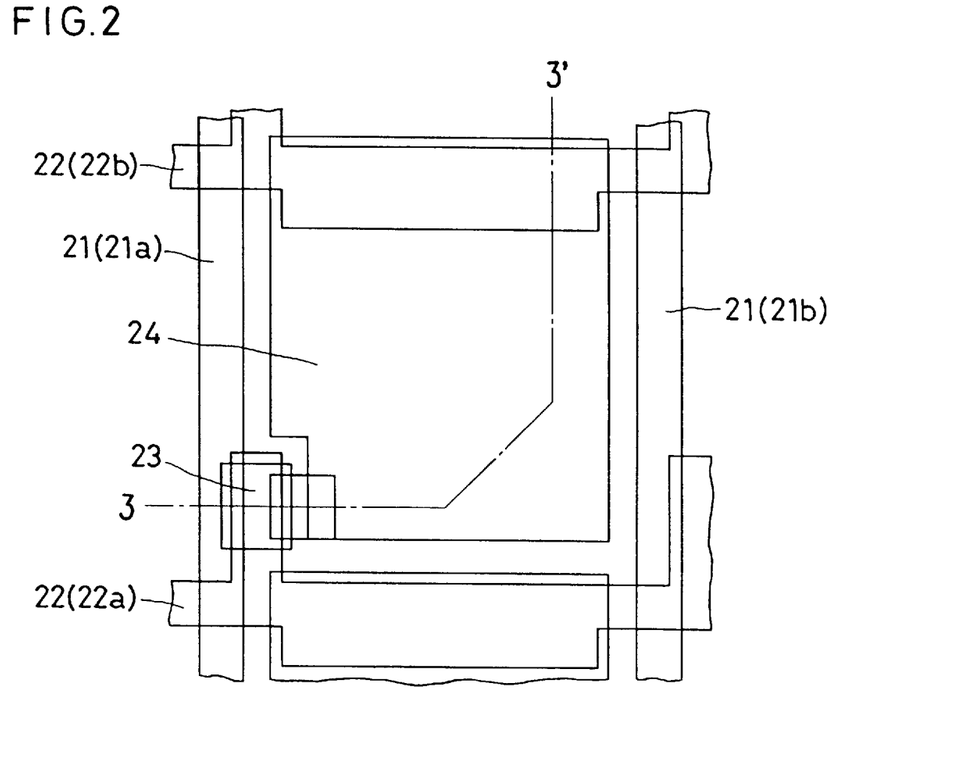
FIG. 2 is a plane view of one pixel of the TFT array panel showing the first embodiment of the LCD device according to the present invention.
Figure 3:
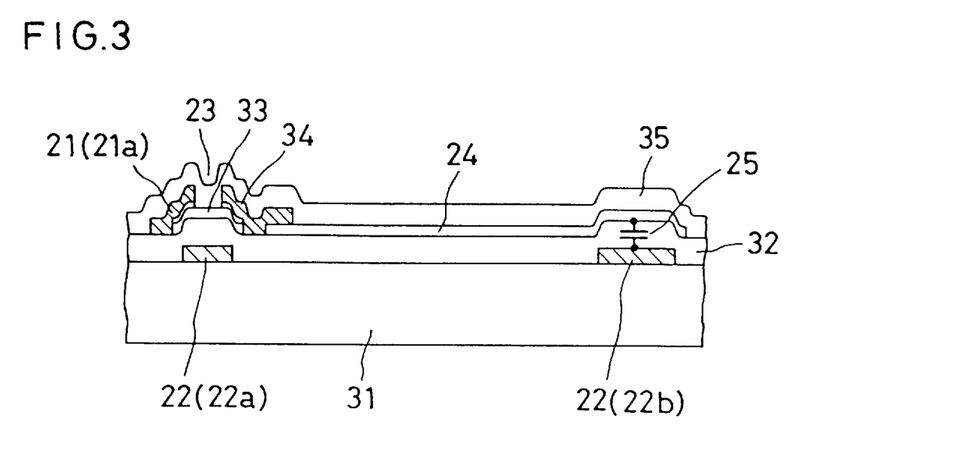
FIG. 3 is a sectional view taken along the line 3–3' of FIG. 2.

FIGS. 1, 2, and 3 show a first embodiment of the present invention, where FIG. 1 is an equivalent circuit diagram of the TFT array panel in the LCD device, FIG. 2 is a plane view of one pixel in the LCD device, and FIG. 3 is a sectional view taken along the line 3–3' of FIG. 2.

As shown in FIG. 1, image signal lines 21 and scan signal lines 22 are provided in an image display area X so as to cross each other, wherein at places where the image signal lines 21 and the scan signal lines 22 cross each other, provided are switching devices 23 and pixel electrodes 24 connected to the switching devices 23. Also, an additional capacitor 25 is formed between a pixel electrode 24 and its preceding-stage or succeeding-stage scan signal line 22.

As shown in FIGS. 2 and 3, the switching device 23 is composed mainly of a gate electrode 22a formed on a substrate 31, an insulating film 32, a semiconductor film 33, a source electrode 21a and a drain electrode 34 formed on the semiconductor film 33 and the insulating film 32. On the side on which the drain electrode 34 of the insulating film 32 is formed, a pixel electrode 24 is formed so as to cover its adjacent scan signal line 22b. Therefore, the drain electrode 34 of the switching device 23 and the pixel electrode 24 can be connected without forming contact holes in the insulating film 32. Further, the pixel electrode 24 itself serves also as an additional capacitor electrode, so that contact holes for connecting the pixel electrode to the additional capacitor electrode are not required, either.

The switching device 23 as shown in FIG. 3 is a transistor of a reverse stagger structure in which the source electrode 21a and the drain electrode 34 are formed on the front surface side of the insulating film 32. However, the switching device 23 may also be a transistor of a stagger structure that the insulating film 32 is sandwiched. When the switching device 23 is provided by a transistor of the stagger structure, it is appropriate that the semiconductor film 33, the source electrode 21a, the drain electrode 34, and the pixel electrode 24 are placed on the rear surface side of the insulating film 32, while the gate electrode 22a and its adjacent scan signal line 22b are placed on the front surface side of the insulating film 32. In this case, the image signal line 21 is placed on the rear surface side of the insulating film 32, while the scan signal line 22 is placed on the front surface side of the insulating film 32.

As shown in FIG. 1, a short-circuit ring line 27b is provided outside the image display area X, and a plurality of image signal lines 21 are connected to the short-circuit ring line 27b via two transistors 26a, 26b. Also, a second short-circuit ring line 27a for connecting a plurality of scan signal lines 22 is provided, and the second short-circuit ring line 27a and the short-circuit ring line 27b are connected to each other via a capacitor 38.

Figure 4:
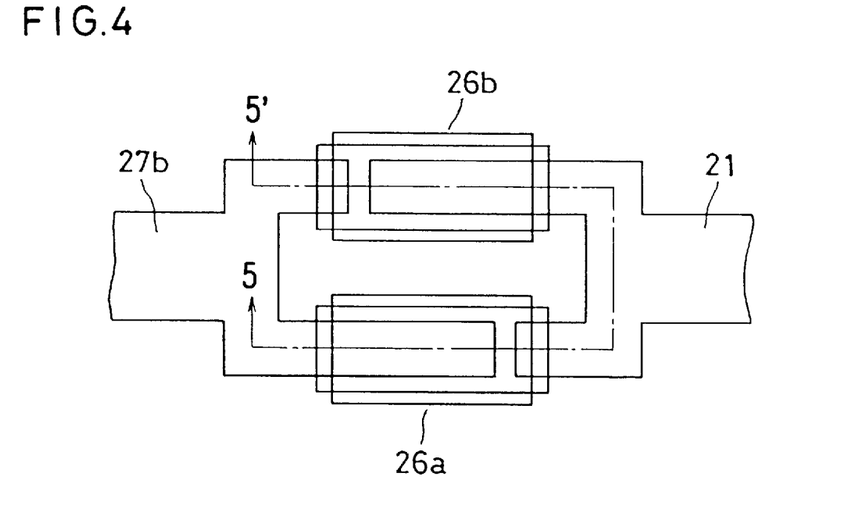
FIG. 4 is a plane view of a transistor portion showing the first embodiment of the LCD device according to the present invention.
Figure 5:
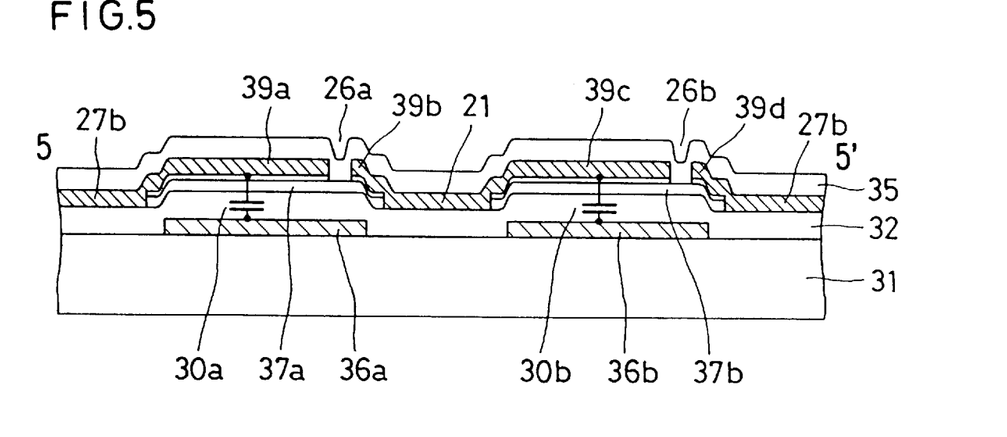
FIG. 5 is a sectional view taken along the line 5–5' of FIG. 4.

As shown in FIGS. 4 and 5, the transistor 26a is formed in such a way that a gate electrode 36a and a source electrode or drain electrode 39a partially overlap each other via the insulating film 32, where they are capacitance-coupled at this overlapping portion to form a capacitor 30a. Also, the transistor 26b is formed in such a way that a gate electrode 36b and a source electrode or drain electrode 39c partially overlap each other via the insulating film 32, where they are capacitance-coupled at this overlapping portion to form a capacitor 30b. That is, the gate electrode and the source electrode or drain electrode are not connected to each other via contact holes, unlike the conventional TFT array panel.

Even if the image signal lines 21 are charged with a positive or negative high voltage due to static electricity or the like, the gate electrodes 36a, 36b of the transistors 26a, 26b are capacitance-coupled to the short-circuit ring line 27b serving also as the source electrodes or drain electrodes 39a, 39c or the image signal lines 21 by the capacitors 30a, 30b. Therefore, with a pulse voltage of static electricity or the like, the capacitance-coupling portion comes into an apparent short-circuited state, so that the transistor 26a or transistor 26b turns on, causing the charges to be discharged to the static electricity absorbing capacitor 38 through the short-circuit ring line 27b. In this way, dielectric breakdown can be prevented.

These high-voltage protection transistors 26a, 26b may be formed at the same time as the switching devices 23 in the display area X as shown in FIG. 1 are formed.

In addition, in order to avoid the formation of contact holes in the insulating film 32 as much as possible, it is desirable to connect the short-circuit ring line 27b and the second short-circuit ring line 27a to each other via the capacitor 38. However, as described later, the short-circuit ring line 27b and the second short-circuit ring line 27a may also be connected directly to each other, other than by capacitance coupling.

Figure 6:
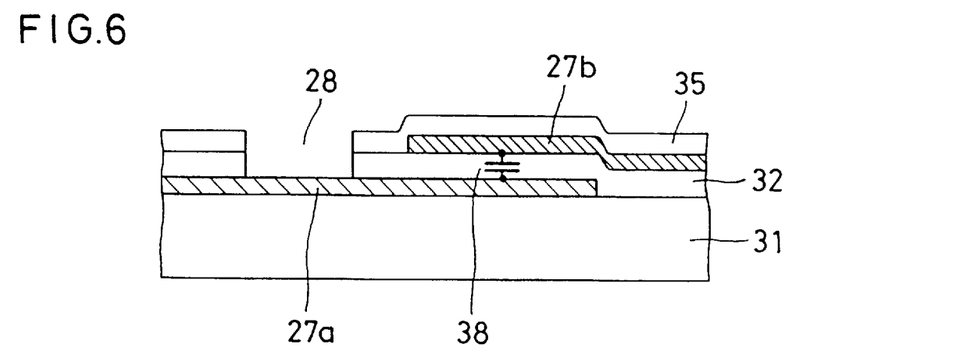
FIG. 6 is a sectional view showing a capacitance-coupling portion of the short-circuit ring line of the LCD device according to the present invention.

In the embodiments as shown in FIGS. 1 and 6, as shown in FIG. 1, the short-circuit ring line 27b to which a plurality of image signal lines 21 are connected via the two transistors 26a, 26b is provided, and besides the second short-circuit ring line 27a to which a plurality of scan signal lines 22 are connected is provided, wherein the short-circuit ring line 27b and the second short-circuit ring line 27a are capacitance-coupled to each other via the capacitor 38. That is, as shown in FIG. 6, the second short-circuit ring line 27a and the short-circuit ring line 27b are formed so as to partially overlap each other via the insulating film 32, where the capacitor 38 is formed in the insulating film 32. Accordingly, the second short-circuit ring line 27a and the short-circuit ring line 27b are capacitance-coupled by the capacitor 38, so that static electricity generated between the image signal lines 21 and the scan signal lines 22 will be absorbed by the capacitor 38.

In addition, in order to avoid the formation of contact holes in the insulating film 32 as much as possible, the gate electrodes and the source electrodes or drain electrodes of the transistors 26a, 26b that connect a plurality of image signal lines 21 to the short-circuit ring line 27b are desirably formed so as to partially overlap each other, so that they are capacitance-coupled.

In this first embodiment, the second short-circuit ring line to which a plurality of scan signal lines are connected is provided and this second short-circuit ring line is capacitance-coupled to the short-circuit ring line to which a plurality of image signal lines are connected via transistors. With this arrangement, for the pseudo connection of the plurality of scan signal lines and the short-circuit ring line, they can be connected without forming contact holes in the insulating film. Thus, there can be provided a low-cost LCD device that is simple in fabricating processes and prevented from reduction in fabrication yield.

Further, the short-circuit ring line 27b and second short-circuit ring line 27a of the TFT array panel of the LCD device as shown in FIG. 1 are intended to prevent the insulating film from electrostatic breakdown during the fabricating processes. In actual use as an LCD device, the short-circuit ring line 27b and the second short-circuit ring line 27a are disconnected from each other.

Figure 7:
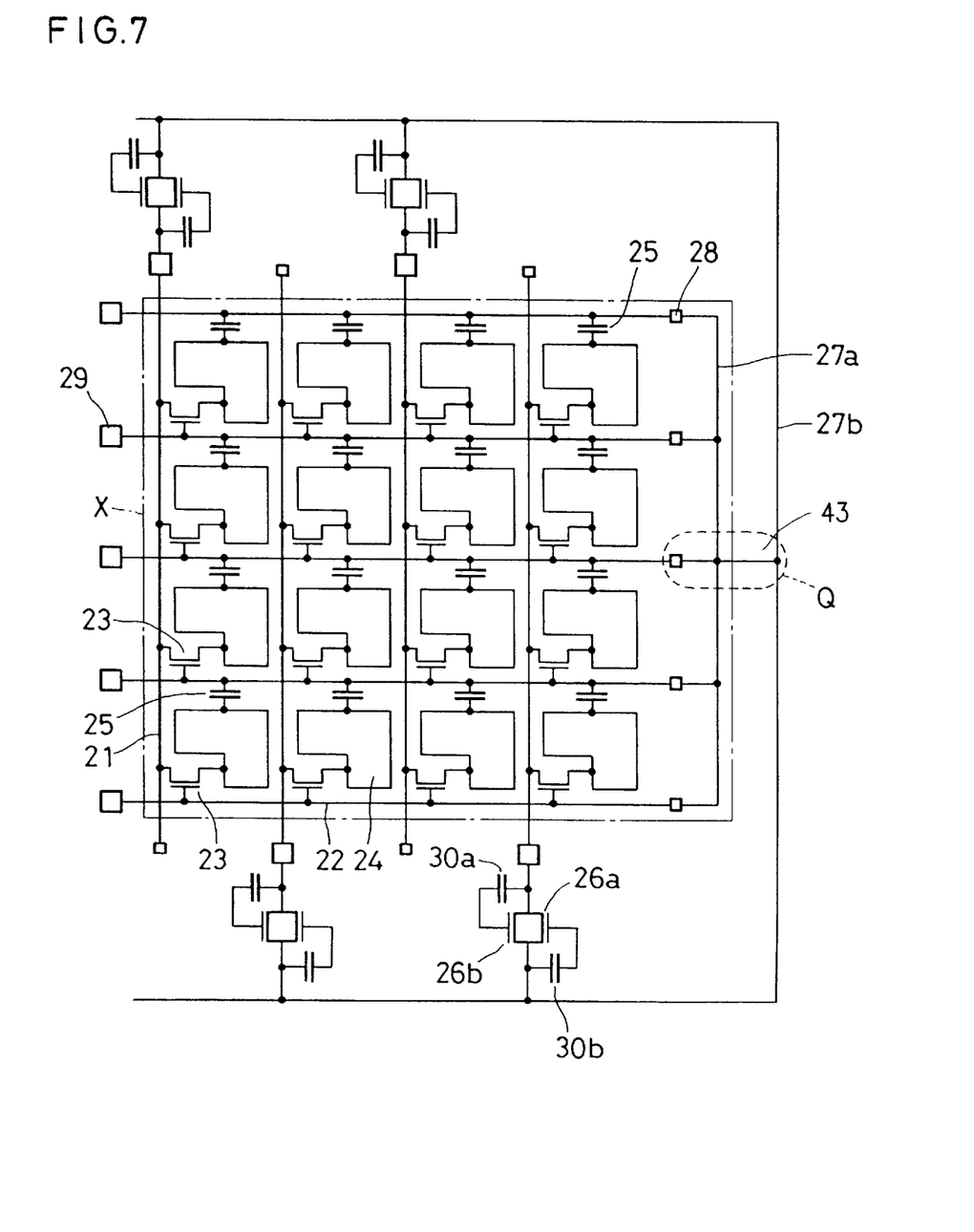
FIG. 7 is a view for explaining a fabricating method showing a second embodiment of the LCD device according to the present invention.
Figure 8:
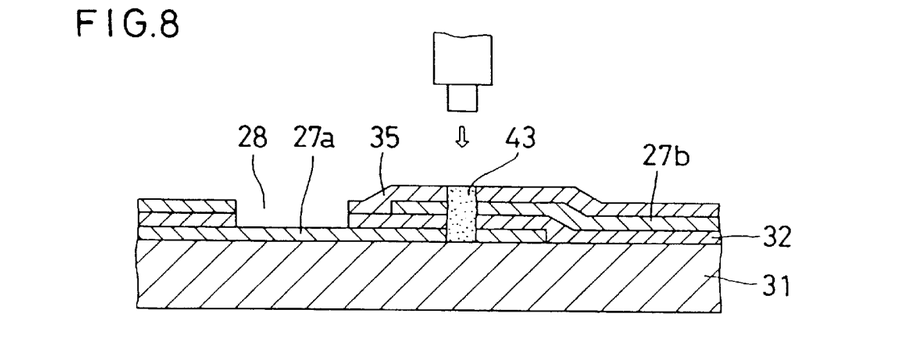
FIG. 8 is an enlarged sectional view of Q portion of FIG. 7.

A second embodiment as shown in FIGS. 7 and 8 is a method for fabricating the LCD device according to the foregoing first embodiment, in which the first short-circuit ring line 27b and the second short-circuit ring line 27a are electrically short-circuited.

In this second embodiment, a second short-circuit ring line 27a to which a plurality of scan signal lines 22 is provided, wherein the second short-circuit ring line 27a and the short-circuit ring line 27b are connected to each other via an interconnection 43.

FIG. 8 is a view showing the method of forming the interconnection 43 at Q portion as shown in FIG. 7. The second short-circuit ring line 27a and the first short-circuit ring line 27b are formed so as to partially overlap each other via the insulating film 32. To this overlapping portion, a laser beam is applied so that the first short-circuit ring line 27b, the second short circuit ring line 27a, and the insulating film 32 are fused and solidified, whereby the first short-circuit ring line 27b and the second short-circuit ring line 27a are electrically connected to each other.

The first short-circuit ring line 27b and the second short-circuit ring line 27a are formed from, for example, aluminium (Al) or titanium (Ti) into a thickness of about 3000–4000 Å. The insulating film 32 is formed from, for example, silicon nitride ($SiN_x$), silicon dioxide ($SiO_2$), or tantalum oxide ($TaO_x$) into a thickness of about 1000–4000 Å.

To their overlapping portion, a laser beam is applied so that the insulating films 32, 35, the first short-circuit ring line 27b, and the second short-circuit ring line 27a are fused wholly into one body. In this way, by applying a laser beam to the overlapping portion of the first short-circuit ring line 27b and the second short-circuit ring line 27a so that they are fused and solidified, the first short-circuit ring line 27b and the second short-circuit ring line 27a are connected to each other in a state of a few Ω to a few kΩ electrical resistance. In addition, since the electrostatic breakdown can be prevented with a connection resistance of not higher than 1MΩ between the first short-circuit ring line 27b and the second short-circuit ring line 27a, a connection resistance of a few kΩ is enough to prevent the electrostatic breakdown. The laser to be applied may be YAG laser with an about 1064 nm oscillation wavelength.

Further, the first short-circuit ring line 27b and the second short-circuit ring line 27a as shown in FIG. 7 are intended to prevent the insulating film 32 from electrostatic breakdown during the fabricating processes. In actual use as an LCD device, the short-circuit ring line 27b and the second short-circuit ring line 27a are disconnected from each other.

In this second embodiment, the first short-circuit ring line to which a plurality of image signal lines are connected, and the second short-circuit ring line to which a plurality of scan signal lines are connected, are provided so as to be laminated with an insulating film sandwiched therebetween. Then, a laser beam is applied to this laminated portion of the first short-circuit ring line and the second short-circuit ring line, so that the first short-circuit ring line and the second short-circuit ring line are electrically connected to each other. Thus, the first short-circuit ring line and the second short-circuit ring line can be connected to each other without forming contact holes in the insulating film. As a result, the fabricating processes are simplified, the reduction in fabrication yield can be prevented, and static electricity generated between the first short-circuit ring line and the second short-circuit ring line can be absorbed completely.

Further, the gate electrode and the source electrode or drain electrode of transistors that connect the image signal lines to the first short-circuit ring line are capacitance-coupled without being physically directly connected to each other. Thus, the fabricating processes are not so complicated.

Next, a third embodiment as shown in FIGS. 9 through 15 is so arranged that a scan-signal-line short-circuit line 41a and an image-signal-line short-circuit line 41b are provided around the image display area X, instead of the short-circuit ring lines of the first and second embodiments.

Figure 9:
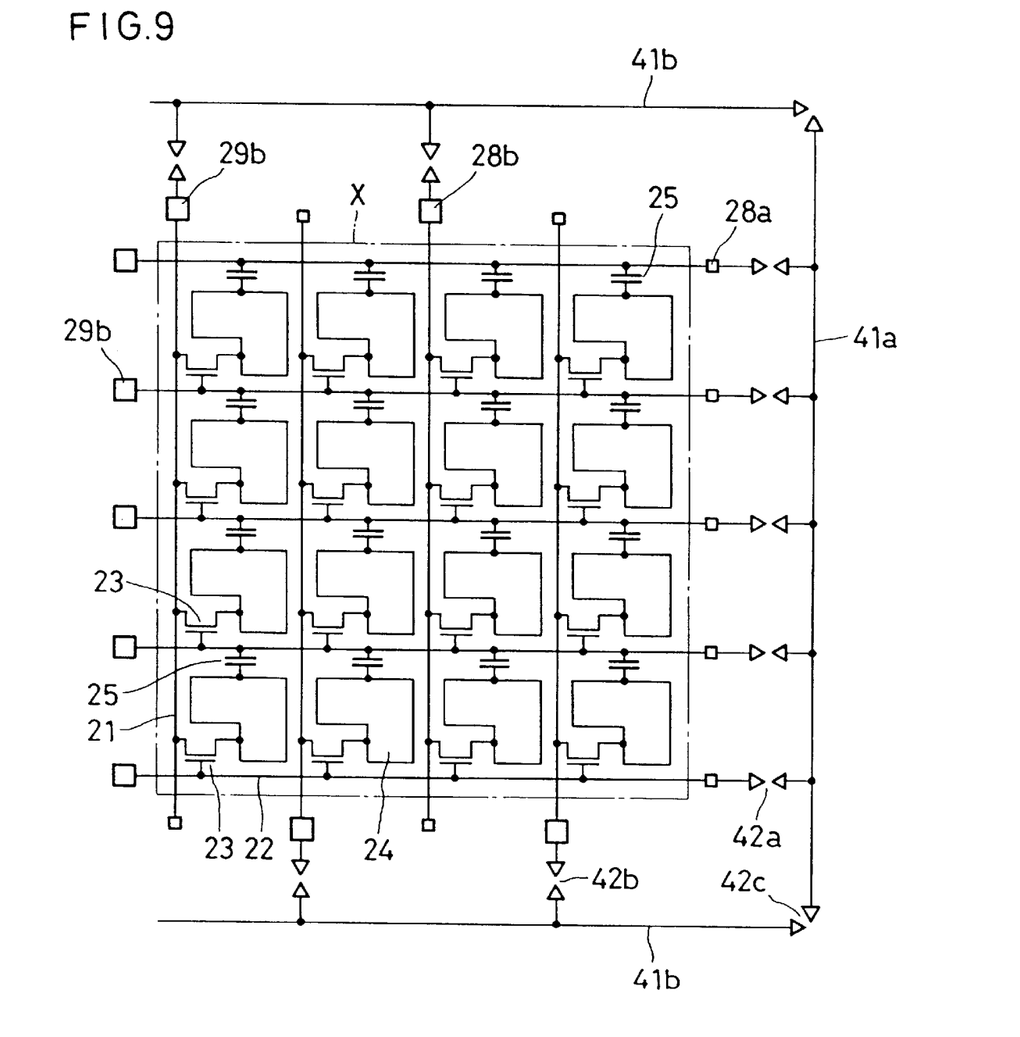
FIG. 9 is a plane view of a TFT array panel showing a third embodiment of the LCD device according to the present invention.

Outside the scan signal lines 22 around the image display area X, provided is the scan-signal-line short-circuit line 41a for discharging static electricity with which the plurality of scan signal lines 22 are charged, as shown in FIG. 9. The scan-signal-line short-circuit line 41a and the plurality of scan signal lines 22 are provided in close proximity to each other at first proximate portions 42a.

Also, outside the image signal lines 21 around the image display area X, provided is the image-signal-line short-circuit line 41b for discharging static electricity with which the plurality of image signal lines 21 are charged. The image-signal-line short-circuit line 41b and the plurality of image signal lines 21 are provided in close proximity to each other at second proximate portions 42b.

Further, one end portion of the scan-signal-line short-circuit line 41a and one end portion of the image signal-line short-circuit line 41b are provided in close proximity to each other at third proximate portions 42c.

Figure 10:
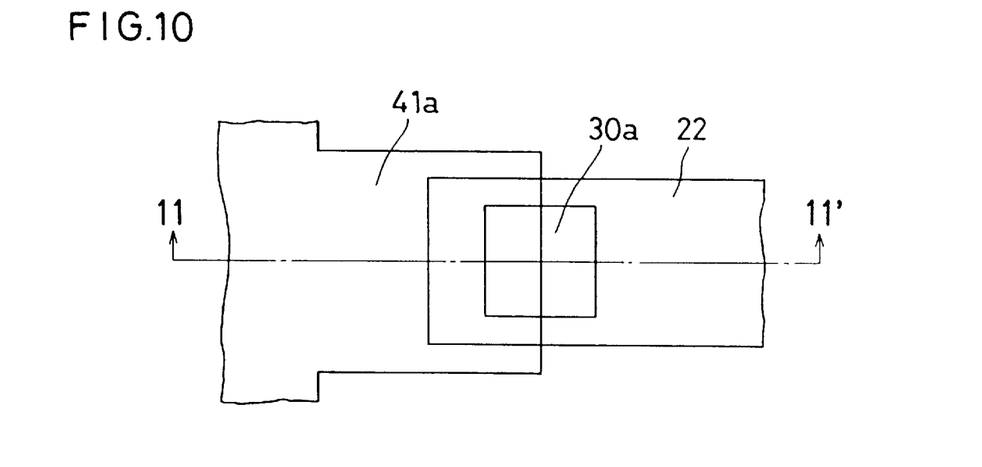
FIG. 10 is an enlargement plane view of 42a portion of FIG. 9.
Figure 11:
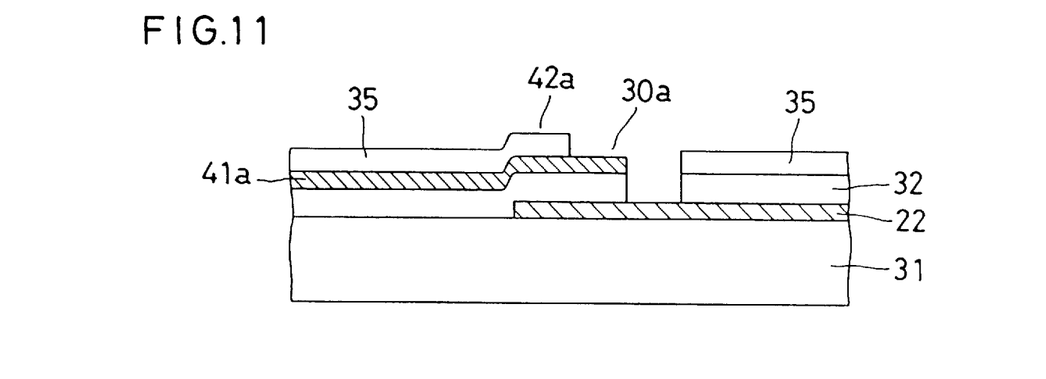
FIG. 11 is a sectional view taken along the line 11–11' of FIG. 10.

The first proximate portion 42a, as shown in FIGS. 10 and 11, is formed in such a way that the scan signal line 22 and the scan-signal-line short-circuit line 41a are laminated so as to partially overlap each other via the insulating film 32. Further formed on these layers is a protective film 35. At this laminated portion, the scan-signal-line short-circuit line 41a and the scan signal line 22 are formed so as to be exposed. In this case, the insulating film 32 is the same layer as the gate insulating film of the transistor 23, having a thickness of not more than 1 μm, usually not more than 5000 Å. Therefore, when a high voltage of a few kV like static electricity is applied between the lines 22 and 41a, the voltage difference between the lines 22 and 41a is reduced by electric discharge. Further, when a relatively low voltage of a few tens V is applied, the voltage difference between the lines 22 and 41a becomes approximately 0 V due to a small leak current flowing on the surface of the insulating film 32.

Figure 12:
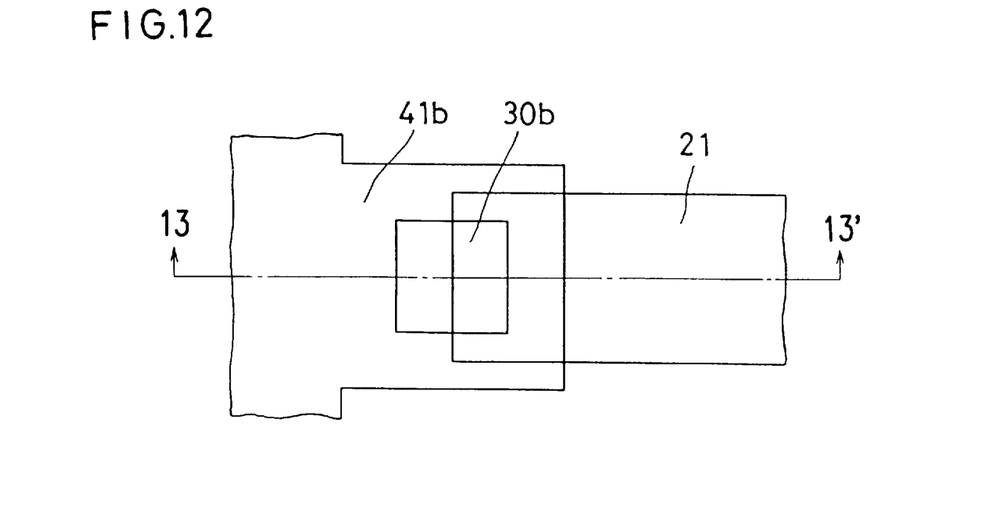
FIG. 12 is an enlargement plane view of 42b portion of FIG. 9.
Figure 13:
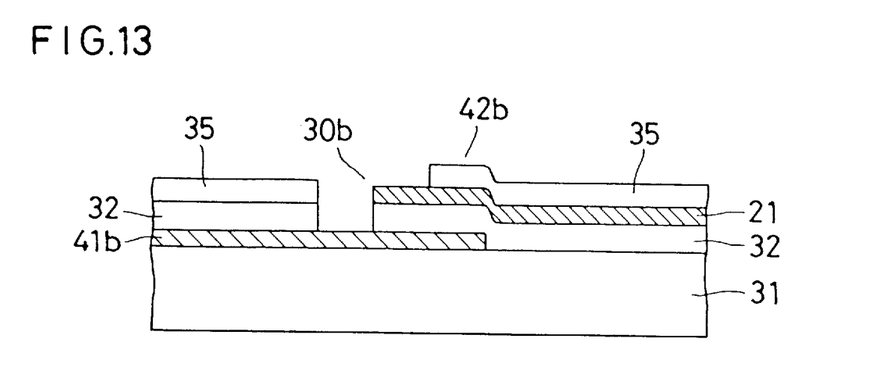
FIG. 13 is a sectional view taken along the line 13–13' of FIG. 12.

Also, the second proximate portion 42b, as shown in FIGS. 12 and 13, is formed in such a way that the image signal lines 21 and the image-signal-line short-circuit line 41b are laminated so as to partially overlap each other via the insulating film 32. Further formed on these layers is a protective film 35. At this laminated portion, the image-signal-line short-circuit line 41b and the image signal lines 21 are formed so as to be exposed. In this case, the insulating film 32 is the same layer as the gate insulating film of the transistor 23, having a thickness of not more than 1 μm, usually not more than 5000 Å. Therefore, when a high voltage of a few kV like static electricity is applied between the lines 21 and 41b, the voltage difference between the lines 21 and 41b is reduced by electric discharge. Further, when a relatively low voltage of a few tens V or so is applied, the voltage difference between the lines 21 and 41b become approximately 0 V due to a small leak current flowing on the surface of the insulating film 32.

Figure 14:
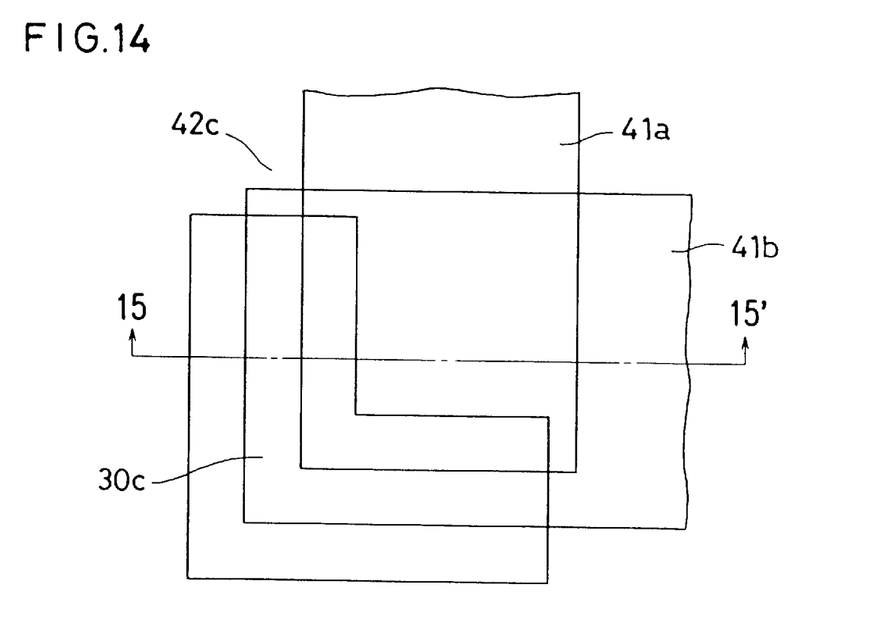
FIG. 14 is an enlargement plane view of 42c portion of FIG. 9.
Figure 15:
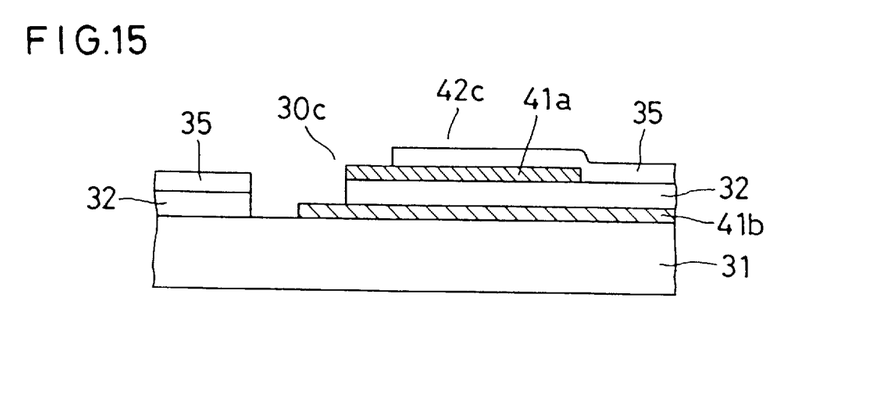
FIG. 15 is a sectional view taken along the line 15–15' of FIG. 14.

Further, the third proximate portion 42c, as shown in FIGS. 14 and 15, is formed in such a way that the scan-signal-line short-circuit line 41a and the image-signal-line short-circuit line 41b are laminated so as to partially overlap each other via the insulating film 32. Further formed on these layers is a protective film 35. At this laminated portion, the scan-signal-line short-circuit line 41a and the image-signal-line short-circuit line 41b are formed so as to be exposed. In this case, the insulating film 32 is the same layer as the gate insulating film of the transistor 23, having a thickness of not more than 1 μm, usually not more than 5000 Å. Therefore, when a high voltage of a few kV like static electricity is applied between the lines 41a and 41b, the voltage difference between the lines 41a and 41b is reduced by electric discharge. Further, when a relatively low voltage of a few tens V is applied, the voltage difference between the lines 41a and 41b becomes approximately 0 V due to a small leak current flowing on the surface of the insulating film 32.

In addition, if the scan-signal-line short-circuit line 41a or the image-signal-line short-circuit line 41b is provided at a large width, static electricity generated to the scan signal lines 22 or the image signal lines 21 can be absorbed to some extent only by the scan-signal-line short-circuit line 41a or the image-signal-line short-circuit line 41b. However, if the scan-signal-line short-circuit line 41a and the image-signal-line short-circuit line 41b are provided in a close proximity to each other as described above, the potential difference between the scan signal lines 22 and the image signal lines 21 can be eliminated completely, so that the electrostatic breakdown between the scan signal lines 22 and the image signal lines 21 can be prevented completely.

Further, the scan-signal-line short-circuit line 41a and image-signal-line short-circuit line 41b of the TFT array panel of the LCD device as shown in FIG. 9 are intended to prevent the insulating film from electrostatic breakdown during the fabricating processes. In use as an LCD device, the scan-signal-line short-circuit line 41a and the image-signal-line short-circuit line 41b are disconnected from each other. Also, an opposite substrate (not shown) is placed so that opposite electrodes (not shown) are positioned so as to face the pixel electrodes 24, and the liquid crystal material is sandwiched by the two substrates, thus implementing the function as an LCD device.

Next, the method for fabricating the TFT array panel used for the LCD device according to the third embodiment is described with reference to FIGS. 3 and 9. On a substrate 31, gate electrodes 22a and scan signal lines 22b made of aluminium (Al), nickel (Ni), titanium (Ti), or the like are formed by vacuum deposition or sputtering process. Then, a gate insulating film (insulating film) 32 made of silicon nitride ($SiN_x$), silicon dioxide ($SiO_2$), tantalum oxide ($TaO_x$), or the like is formed by plasma CVD or sputtering process. Subsequently, pixel electrodes 24 are formed by ITO or other transparent conductive films. Thereafter, a semiconductor film 33 made of amorphous silicon or the like and source-drain electrodes 21a, 34 (image signal lines 21) made of aluminium (Al), nickel (Ni), titanium (Ti), or the like are formed. Finally, a protective film 35 of silicon nitride film, silicon dioxide film, or the like is formed by plasma CVD process or the like.

In order that the scan signal lines 22 and the scan-signal-line short-circuit line 41a are partially exposed at the first proximate portion 42a, it is appropriate, as shown in FIGS. 10 and 11, that the scan signal lines 22 and the scan-signal-line short-circuit line 41a are laminated so as to partially overlap each other, while the protective film 35 and the insulating film 32 are etched with a pattern including the tip end portion of the scan-signal-line short-circuit line 41a. By simultaneously etching the protective film 35 and the insulating film 32 with such a pattern, the scan signal lines 22 and the scan-signal-line short-circuit line 41a can be exposed through one process. It is noted that the part lower than the scan-signal-line short-circuit line 41a is masked by the scan-signal-line short-circuit line 41a, and therefore will not be etched. This is also the case with the second proximate portion 42b and the third proximate portion 42c.

According to the third embodiment, a plurality of scan signal lines and the scan-signal-line short-circuit line, a plurality of image signal lines and the image-signal-line short-circuit line, as well as the scan-signal-line short-circuit line and the image-signal-line short-circuit line can be pseudo-connected to each other, respectively, in a simple construction without forming contact holes in the insulating film. Further, static electricity applied to the scan signal lines and the image signal lines is discharged to the short-circuit lines, whereby the insulating film can be prevented from breakdown due to static electricity and the switching devices can be prevented from characteristic deteriorations. Also, in the processes of connecting the pixel electrodes and the switching devices to each other, or forming the additional capacitor electrodes, there is no need of forming contact holes in the insulating film. Thus, there can be provided a low-cost, high-reliability LCD device which is simple in fabricating processes, prevented from reduction in fabricating yield, and protectable from static electricity.

What is claimed is:

1. A liquid crystal display device comprising:

a plurality of image signal lines and a plurality of scan signal lines provided so as to cross each other via an insulating film;

pixel electrodes and switching devices for feeding an image signal to the pixel electrodes, in which the pixel electrodes and the switching devices are provided at intersecting points of the image signal lines and the scan signal lines, the switching devices each having at least a gate electrode, the insulating film, a semiconductor film, a source electrode, and a drain electrode; and a liquid crystal material which is sandwiched between the pixel electrodes and opposite electrodes provided opposite to the pixel electrodes, wherein the pixel electrodes and the drain electrodes of the switching devices are provided on the same surface of the insulating film;

a short-circuit ring line to which the plurality of image signal lines are connected via a transistor having at least a gate electrode, an insulating film, a source electrode and a drain electrode; and the gate electrode and the source electrode or the drain electrode of said transistor are capacitance-coupled to each other via the insulating film of said transistor.

2. The liquid crystal display device as claimed in claim 1, further comprising a second short-circuit ring line to which the plurality of scan signal lines are connected, wherein the second short-circuit ring line and the short-circuit ring line to which the plurality of image signal lines are connected via the transistors are capacitance-coupled to each other.

3. A liquid crystal display device comprising:

a plurality of image signal lines and a plurality of scan signal lines provided so as to cross each other via an insulating film;

pixel electrodes and switching devices for controlling feed of an image signal to the pixel electrodes, in which the pixel electrodes and the switching devices are provided at intersecting portions of the image signal lines and the scan signal lines; and a display area having a liquid crystal material sandwiched between the pixel electrodes and opposite electrodes provided opposite to the pixel electrodes, wherein the plurality of scan signal lines and a scan-signal-line short-circuit line for discharging static electricity of the plurality of scan signal lines are provided so as to be laminated via the insulating film outside the display area; and the scan-signal-line short-circuit line and the scan signal lines are at least partially exposed at the laminated portion.

4. The liquid crystal display device as claimed in claim 3, wherein the switching devices each comprise:

a gate electrode formed by part of the scan signal line; a gate insulating film formed by the insulating film;

a channel portion made of a semiconductor film provided on the gate insulating film;

a source electrode formed by part of the image signal line; and a drain electrode formed by a cut and removed portion of the image signal line, wherein the drain electrodes of the switching devices and the pixel electrodes are formed on the same surface of the insulating film.

5. A liquid crystal display device comprising:

a plurality of image signal lines and a plurality of scan signal lines provided so as to cross each other via an insulating film;

pixel electrodes and switching devices for controlling feed of an image signal to the pixel electrodes, in which the pixel electrodes and the switching devices are provided at intersecting portions of the image signal lines and the scan signal lines; and a display area having a liquid crystal material sandwiched between the pixel electrodes and opposite electrodes provided opposite to the pixel electrodes, wherein the plurality of image signal lines and an image-signal-line short-circuit line for discharging static electricity of the plurality of image signal lines are provided so as to be laminated via the insulating film outside the display area; and the image signal lines and the image-signal-line short-circuit line are at least partially exposed at the laminated portion.

6. The liquid crystal display device as claimed in claim 5, wherein the pixel electrodes and drain electrodes of the switching devices are formed on the same surface of the insulating film.

7. A liquid crystal display device comprising:

a plurality of image signal lines and a plurality of scan signal lines provided so as to cross each other via an insulating film;

pixel electrodes and switching devices for controlling feed of an image signal to the pixel electrodes, in which the pixel electrodes and the switching devices are provided at intersecting portions of the image signal lines and the scan signal lines; and a display area having a liquid crystal material sandwiched between the pixel electrodes and opposite electrodes provided opposite to the pixel electrodes, wherein a scan-signal-line short-circuit line for discharging static electricity of the plurality of scan signal lines and an image-signal-line short-circuit line for discharging static electricity of the plurality of image signal lines are provided so as to be laminated via the insulating film outside the display area; and the scan-signal-line short-circuit line and the image-signal-line short-circuit line are at least partially exposed at the laminated portion.

8. The liquid crystal display device as claimed in claim 7, wherein the pixel electrodes and drain electrodes of the switching devices are formed on the same surface of the insulating film.

* * * * *